United States Patent [19]

Allen

[11] 4,237,389
[45] Dec. 2, 1980

[54] CHARGE COUPLED DEVICE CHANNEL CROSSOVER CIRCUIT

[75] Inventor: Reginald A. Allen, Topanga, Calif.

[73] Assignee: TRW Inc., Redondo Beach, Calif.

[21] Appl. No.: 938,911

[22] Filed: Sep. 1, 1978

[51] Int. Cl.³ .................. G11C 19/28; H01L 29/78
[52] U.S. Cl. ............................. 307/221 D; 357/24
[58] Field of Search .................. 357/24; 307/221 D

[56] References Cited

U.S. PATENT DOCUMENTS

| | | | |
|---|---|---|---|
| 3,902,186 | 8/1975 | Engeler et al. | 357/24 |
| 3,934,261 | 1/1976 | Sequin | 357/24 |
| 4,010,485 | 3/1977 | Sauer | 357/24 |
| 4,041,521 | 8/1977 | Sunami et al. | 357/24 |
| 4,051,505 | 9/1977 | Krambeck et al. | 357/24 |

OTHER PUBLICATIONS

Sequin "Two-Dimensional Charge-Transfer Arrays" IEEE J. Solid-State Circuits vol. SC-9 (6/74), pp. 134–142.

Primary Examiner—Gene M. Munson
Attorney, Agent, or Firm—Fraser and Bogucki

[57] ABSTRACT

A charge coupled device channel crossover circuit transfers charge packets in each of two different intersecting channels during each of a succession of transfer intervals defined by a pair of clocking signals of opposite phase and a pair of clock signal related pulse trains applied to various electrodes of the crossover circuit to provide changing potential biases. The crossover circuit includes a common transfer area at the intersection of the two channels, a pair of transfer gates within each channel on opposite sides of the transfer area and a pair of storage areas within each channel on opposite sides of the transfer gates from the transfer area. During each transfer interval a charge packet introduced at the input end of one of the channels is transferred through the intersection to the output end of the channel by the changing potential biases, following which a charge packet introduced into the input end of the other channel is transferred through the intersection to the output end of the other channel by bias level changes. The changes in bias level provided by the clocking signals and the pulse trains advance the charge packets through the intersection without interference from one another and so that each charge packet is prevented from traveling in a wrong direction or from entering the other one of the channels.

2 Claims, 8 Drawing Figures

CHARGE COUPLED DEVICE CHANNEL CROSSOVER CIRCUIT

BACKGROUND OF THE INVENTION

1. Field of the Invention

The present invention relates to semiconductor circuits, and more particularly to charge coupled devices (CCDs) in which packets of charge created within a layer of semiconductor material are routed through the semiconductor layer in a desired manner by changing potential bias levels on electrodes mounted on an insulated layer above the semiconductor layer.

2. History of the Prior Art

Charge coupled devices (CCDs) comprise a well known form of semiconductor circuit for storing and processing data. In digital type CCDs binary values are commonly represented by the presence or absence of mobile charge carriers forming charge packets within the semiconductor material. The charge packets, which are stored in potential wells within the semiconductor material formed by application of an appropriate potential level to an electrode disposed over the potential well, are transferred to various other portions of the CCDs in desired fashion by changing the voltage levels applied to various electrodes overlaying the semiconductor material. Digital CCDs are capable of performing a variety of different digital or binary functions including functioning as digital memories and digital logic systems and subsystems.

As the complexity of CCD memories or digital logic functions increases, and as the density of CCDs increases, it becomes advantageous to be able to cross the CCD channels forming the signal paths. The operative link or connection between different elements may thereby be simplified or shortened, easing circuit layout problems and generally increasing density. A gating scheme is required to direct the charge packets or other signaling phenomena through desired portions of the various channels in desired directions and without interference with other charge packets at channel intersections or other common areas.

Channel crossover circuits have heretofore been unduly complex or otherwise impractical. One common technique employs an OR gate plus a channel divider. This approach is complex in terms of the components required and the controlling signals. Still other techniques are unduly complex because of a requirement for complex potential bias signals which are different from the data rate or phase relationship of the signals in the intersecting channels.

Heretofore, arrangements have been devised for controlling the flow of charge packets through intersecting channels as exemplified by U.S. Pat. No. 4,041,521 of Sunami et al and U.S. Pat. No. 4,051,505 of Krambeck et al. However, the Sunami et al and Krambeck et al arrangements relate to shift registers or other arrangements involving serial-to-parallel or parallel-to-serial operation within a matrix in which it is desired to store charge packets at various intersections of the matrix and thereafter transfer the stored packets in desired directions. The Sunami et al and Krambeck et al patents do not address themselves to the problem of a channel crossover circiut where charge packets in intersecting channels are not stored at the intersections but rather are transferred through the intersections substantially simultaneously and yet without interference with one another.

Accordingly, it is an object of the invention to provide a channel crossover circuit of relatively simple design and which is relatively easy to control.

It is a further object of the invention to provide a channel crossover circuit requiring only two intersecting channels having electrodes forming various storage and transfer gate areas therein.

It is a still further object of the invention to provide a channel crossover circuit of relatively simple design and which operates successfully using signals derived from or otherwise related to the data rate of the system.

BRIEF DESCRIPTION OF THE INVENTION

These and other objects in accordance with the invention are accomplished by providing a charge coupled device channel crossover circuit which consists of two intersecting channels and which is readily controlled by opposite phase clocking signals readily derived from the data rate for the system. The clocking signals of opposite phase and which alternate between opposite voltage levels are applied to selected ones of various storage and transfer electrodes within the intersecting channels with the charge coupled device together with two different pulse trains generated in response to the changes in level of the clocking signals. The intersecting channels include a common transfer area at the intersection thereof formed by a transfer electrode to which a constant bias voltage is applied. Each channel includes a pair of transfer gates formed by a pair of transfer electrodes on opposite sides of the common transfer area and a pair of storage areas on the opposite sides of the transfer gates and formed by a pair of storage electrodes. The clocking signals and pulse trains are applied to the various electrodes during each of a succession of transfer intervals so as to transfer first one and then the other of charge packets applied to the inputs of the two different channels through the channels including the intersection thereof without interference with one another. The changing bias levels provided by the clocking signals and the pulse trains cause the charge packet within each channel to be temporarily stored in one of the storage areas from which the packet is thereafter advanced through the transfer gates and the common transfer area to an opposite storage area in essentially a single movement.

BRIEF DESCRIPTION OF THE DRAWINGS

The foregoing and other objects, features and advantages of the invention will be apparent from the following more particular description of a preferred embodiment of the invention, as illustrated in the accompanying drawings, in which.

DETAILED DESCRIPTION

Figure 1:
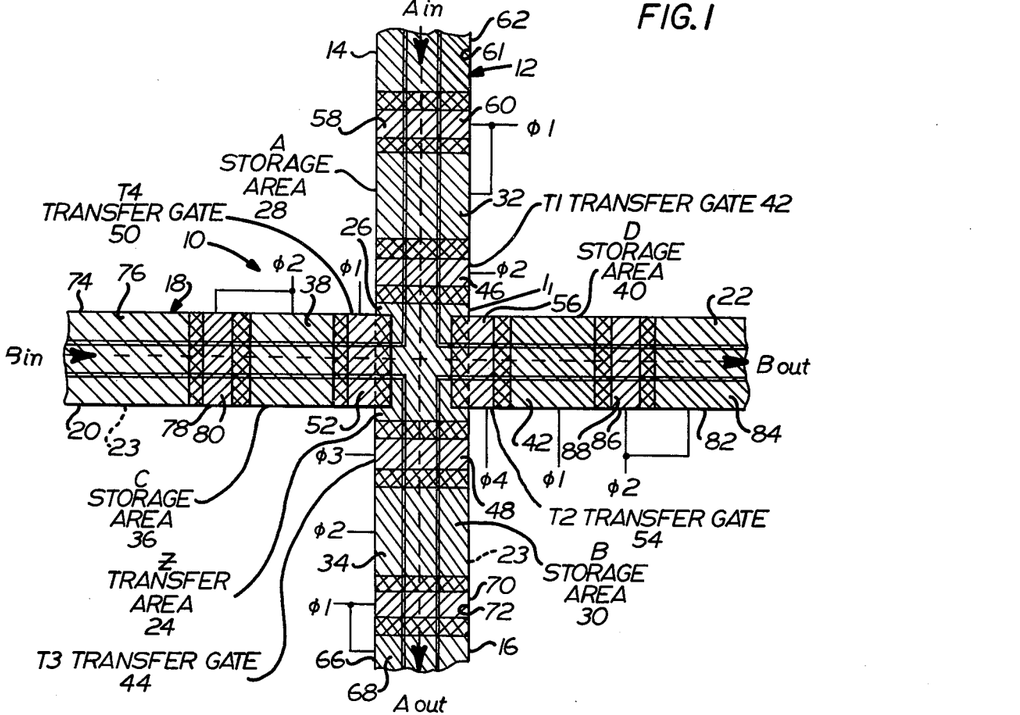
FIG. 1 is a simplified schematic plan view of a charge coupled device channel crossover circuit in accordance with the invention.

FIG. 1 is a simplified schematic plan view of a charge coupled device channel crossover circuit 10 in accordance with the invention. The crossover circuit 10 includes a first channel 12 having an input end 14 for receiving input charge packets or other signal indicia $A_{IN}$ and an output 16 for providing charge packets or other signal indicia $A_{OUT}$ transferred from the input end 14. The crossover circuit 10 also includes a second channel 18 having an input end 20 for receiving charge packets or other signal indicia $B_{IN}$ to be transferred and an output end 22 where transferred charge packets or other signal indicia $B_{OUT}$ appear.

The plan view of FIG. 1 illustrates the various electrodes comprising the top of the crossover circuit 10 as a series of different hatched areas. As described hereafter the electrodes are comprised of storage electrodes and transfer electrodes, and double hatching is shown in those areas where the ends of the transfer electrodes overlap the ends of the storage electrodes. Semiconductor structure 23 underneath the various electrodes shown in FIG. 1 and which, for purposes of the present example, comprises a layer of insulative material such as silicon dioxide disposed over a layer of semiconductor material such as silicon may be of any appropriate conventional construction and therefore is not shown or described herein in detail. The various electrodes shown in FIG. 1 interact with the underlying semiconductor structure 23 in conventional charge coupled device fashion in response to selected variable voltage levels applied thereto to create potential wells thereunder for storage and movement of charge packets in the form of mobile charge carriers injected into the semiconductor structure. As described hereafter the storage electrodes in combination with the underlying semiconductor structure define storage areas, and the transfer electrodes in combination with the underlying structure define transfer gates.

The two channels 12 and 18 intersect at a common Z transfer area 24 formed by a transfer electrode 26 and the underlying semiconductor structure 23. The common Z transfer area 24 is an area through which the charge packets comprising both $A_{IN}$ and $B_{IN}$ must pass on their way to becoming $A_{OUT}$ and $B_{OUT}$ respectively. Each of the channels 12 and 18 includes a pair of storage area at the input and output ends of the channel. The input storage area serves to temporarily store charge packets just prior to transfer through the common Z transfer area 24. The output storage area serves to temporarily store charge packets which have just been transferred through the common Z transfer area 24. The first channel 12 includes an input or A storage area 28 for temporarily storing charge packets to be transferred and an output or B storage area 30 for temporarily storing charge packets which have just been transferred. The A storage area 28 is formed by a storage electrode 32 and the underlying semiconductor structure 23. The B storage area 30 is formed by a storage electrode 34 with the underlying semiconductor structure 23. Likewise the second channel 18 has an input or C storage area 36 formed by a storage electrode 38 and an output or D storage area 40 which includes a storage electrode 42. The storage areas 28 and 30 and their respective included storage electrodes 32 and 34 are disposed on opposite sides of the common Z transfer area as are the storage areas 36 and 40 and the respective storage electrodes 38 and 42 of the second channel 18.

Each of the channels 12 and 18 includes a pair of transfer gates, one of which controls transfer of charge packets from the input storage area to the common Z transfer area 24 and the other of which controls transfer of charge packets from the common Z transfer area 24 into the output storage area. The first channel 12 includes a T1 transfer gate 42 at the input end 14 thereof for controlling the transfer of charge packets from the A storage area 28 to the common Z transfer area 24. The first channel 12 also includes a T3 transfer gate 44 at the output end 16 between the common Z transfer area 24 and the B storage area 30. T1 transfer gate 42 is formed by a transfer electrode 46 and the underlying semiconductor structure 23. The transfer electrode 46 overlaps the storage electrode 32 and the transfer electrode 26. The T3 transfer gate 44 is formed by a transfer electrode 48 and the underlying semiconductor structure 23. The transfer electrode 48 overlaps the transfer electrode 26 and the storage electrode 34. Accordingly the transfer gates 42 and 44 within the first channel 12 are disposed on opposite sides of the common Z transfer area 24 between the transfer area 24 and the opposite storage areas 28 and 30.

The second channel 18 includes a T4 transfer gate 50 disposed between the C storage area 36 and the common Z transfer area 24. The T4 transfer gate 50 includes a transfer electrode 52 overlapping the adjacent edges of the storage electrode 38 and the transfer electrode 26. The T4 transfer gate 50 controls the transfer of charge packets from the C storage area 36 into the common Z transfer area 24. The second channel 18 also includes a T2 transfer gate 54 disposed between and controlling the transfer of charge packets from the common Z transfer area 24 to the D storage area 40. The T2 transfer gate 54 includes a transfer electrode 56 overlapping the adjacent edges of the transfer electrode 26 and the storage electrode 42.

Each of the channels 12 and 18 includes a second pair of transfer gates, a first of which controls transfer of charge packets into the input storage area and the second of which controls transfer of charge packets out of the output storage area. Thus the first channel 12 includes a transfer gate 58 which includes a transfer electrode 60 and which is disposed on the opposite side of the A storage area 28 from the T1 transfer gate 42 and the common Z transfer area 24 so as to control the transfer of $A_{IN}$ charge packets from a storage area 62 formed by a storage electrode 64 into the A storage area 28. The transfer electrode 60 overlaps the adjacent edges of the storage electrodes 64 and 32. Transfer as $A_{OUT}$ of charge packets stored in the B storage area 30 at the output end 16 of the first channel 12 to a storage area 66 formed by a storage electrode 68 controlled by a transfer gate 70 formed by a transfer electrode 72 which overlaps the adjacent edge of the storage electrodes 34 and 68.

Charge packets $B_{IN}$ at the input end 20 of the second channel 18 are initially stored in a storage area 74 formed by a storage electrode 76 prior to being transferred into the C storage area 36 by a transfer gate 78. The transfer gate 78 includes a transfer electrode 80 which overlaps the adjacent edges of the storage electrodes 76 and 38. At the output end 22 of the second channel 18, transfer of the charge packets in the D storage area 40 into a storage area 82 formed by a storage electrode 84 is controlled by a transfer gate 86 formed by a transfer electrode 88 which overlaps the adjacent edges of the storage electrodes 42 and 84.

Figure 2:
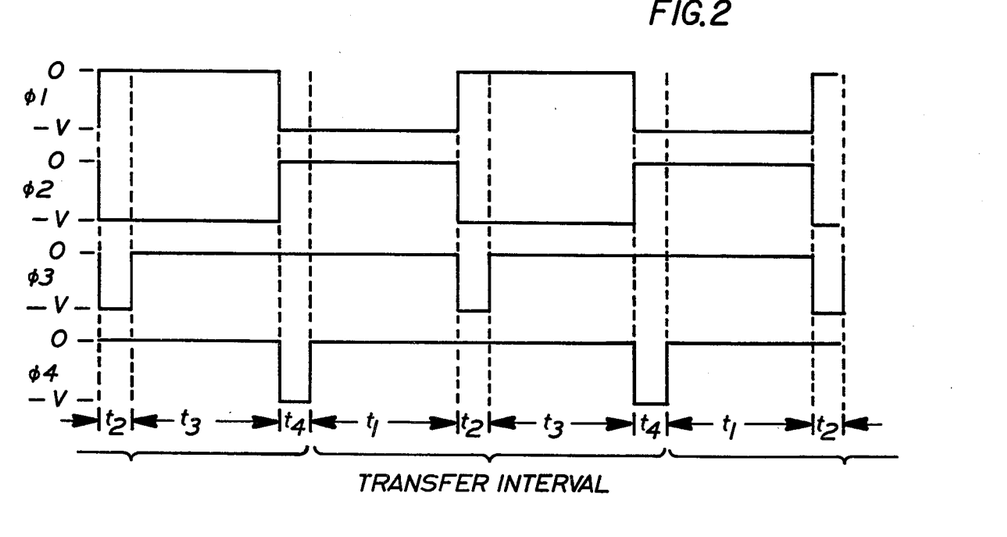
FIG. 2 is a graphical representation of clock voltages, timing waveforms and bias levels utilized in the circuit of FIG. 1.

Transfer of the charge packets through the crossover circuit 10 of FIG. 1 is controlled by changing levels of bias within the various storage areas and transfer gates provided by application of four different timing signals to the various storage and transfer electrodes. The four different timing signals are shown in FIG. 2 and are designated phase 1 ($\phi$ 1), phase 2 ($\phi$ 2), phase 3 ($\phi$ 3) and phase 4 ($\phi$ 4). The $\phi$ 1 and $\phi$ 2 signals are out-of-phase, complementary signals which may comprise or be provided by the clocking signals for the charge coupled device. Each of the $\phi$ 1 and $\phi$ 2 signals repetitively alternates between two different levels, the higher of which is at 0 volts and the lower of which is at a negative voltage of value $-V$ volts. The signals $\phi$ 3 and $\phi$ 4 comprise trains of pulses of value $-V$ volts and of fixed duration. The leading edge of each pulse within the signal $\phi$ 3 commences with the each positive-going transition of the signal $\phi$ 1. Similarly, the leading edge of each pulse of the signal $\phi$ 4 coincides with each positive-going transition of the signal $\phi$ 2. Consequently the pulses within the signal $\phi$ 3 correspond to alternate ones of the level changes in the signals $\phi$ 1 and $\phi$ 2. The pulses comprising the signal $\phi$ 4 correspond to different alternate ones of the level changes of the signals $\phi$ 1 and $\phi$ 2.

The timing signals $\phi$ 1–$\phi$ 4 define a succession of transfer intervals. Each transfer interval is comprised of four different timing intervals $t_1-t_4$. The first timing interval $t_1$ occurs between the termination of each pulse of the signal $\phi$ 4 and the commencement of a pulse in the signal $\phi$ 3 which coincides with the next transistion in the signals $\phi$ 1 and $\phi$ 2. The next timing interval $t_2$ is defined by the duration of the pulse of the timing signal $\phi$ 3. The next timing interval $t_3$ comprises the period between the termination of the $\phi$ 3 pulse and the beginning of the next pulse in the signal $\phi$ 4 which coincides with the next transition in the signals $\phi$ 1 and $\phi$ 2. The final time interval $t_4$ is defined by the duration of the $\phi$ 4 pulse. During each of the transfer intervals defined by the timing intervals $t_1-t_4$ input charge packets $A_{IN}$ and $B_{IN}$ are transferred through the crossover circuit 10 substantially simultaneously but without interference and without any danger of being erroneously transferred into a wrong channel leg.

FIG. 1 shows the particular ones of the timing signals of FIG. 2 as they are applied to the various storage and transfer electrodes. Thus, $\phi$ 1 is applied to the transfer and storage electrodes 60 and 32 at the input end 14 of the first channel 12. In addition, $\phi$ 1 is applied to the storage and transfer electrodes 68 and 72 at the output end 16 of the first channel 12, to the transfer electrode 52 at the input end 20 of the second channel 18 and to the storage electrode 42 at the output end 22 of the second channel 18. The timing signal $\phi$ 2 is applied to the transfer electrode 46 at the input end 14 of the first channel 12, to the storage electrode 34 at the output end 16 of the first channel 12, to the transfer and storage electrodes 80 and 38 at the input end 20 of the second channel 18 and to the transfer and storage electrodes 88 and 84 at the output end 22 of the second channel 18. The timing signal $\phi$ 3 is applied to the transfer electrode 48 at the output end 16 of the first channel 12, while the timing signal $\phi$ 4 is applied to the transfer electrode 56 at the output end 22 of the second channel 18.

The transfer electrode 26 at the common Z transfer area 24 is coupled to be biased by a negative DC voltage $V_1$. Consequently the common Z transfer area 24 always has a potential well thereunder for passing a charge packet therethrough.

Figure 3:
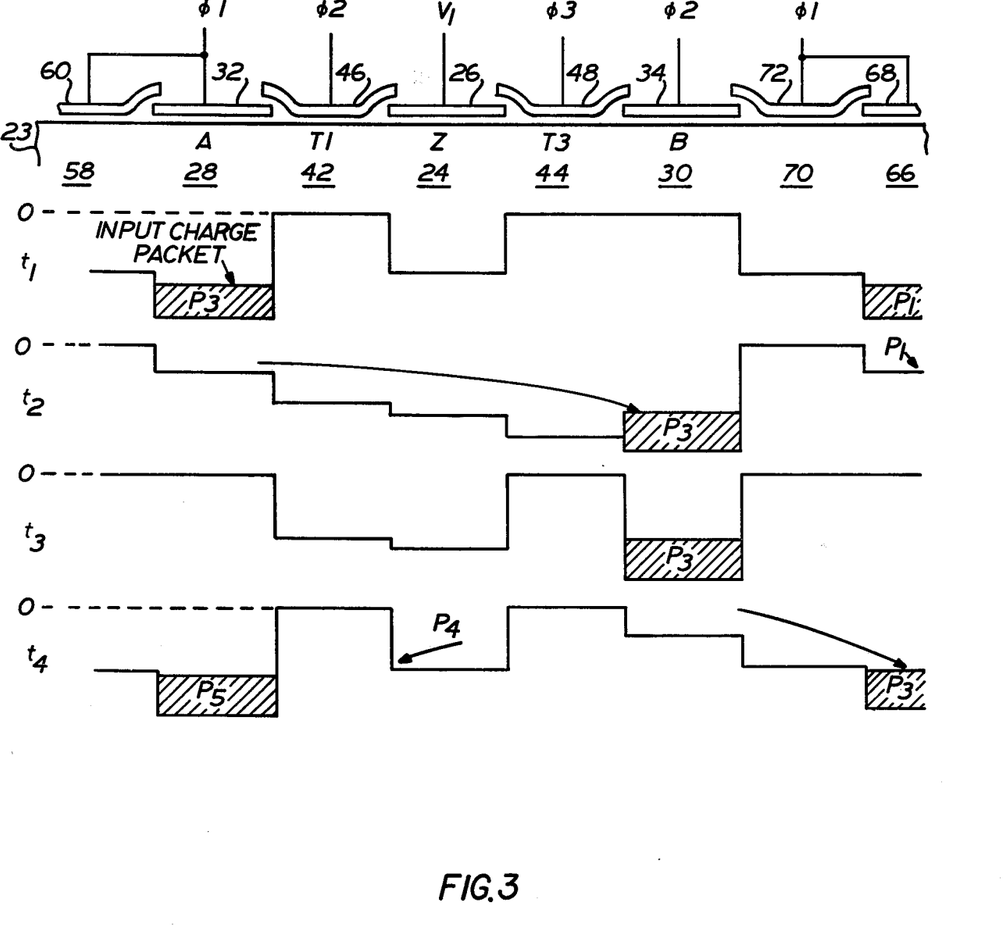
FIG. 3 is a simplified graphical representation of bias levels illustrating the manner in which a charge packet is transferred from the A storage area to the B storage area in the circuit of FIG. 1.
Figure 4:
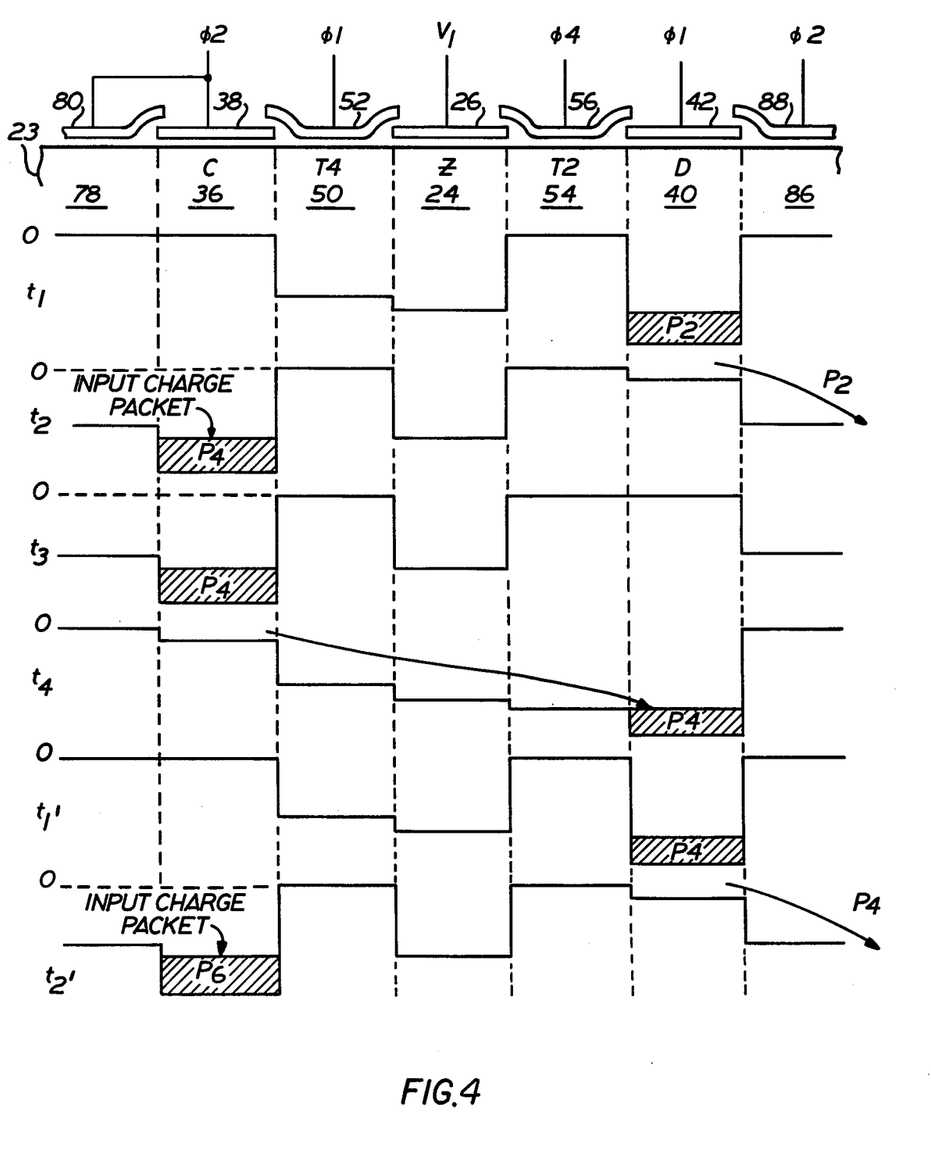
FIG. 4 is a simplified graphical representation of bias levels illustrating the manner in which a charge packet is transferred from the C storage area to the D storage area in the circuit of FIG. 1.

The operation of the crossover circuit 10 of FIG. 1 in response to the application of the timing signals of FIG. 2 is illustrated by the various graphical representations of FIGS. 3–8. FIG. 3 depicts the first channel 12 including the A storage area 28, the T1 transfer gate 42, the T3 transfer gate 44 and the B storage area 30. FIG. 4 depicts the second channel 18 including the C storage area 36, the T4 transfer gate 50, the T2 transfer gate 54 and the D storage area 40. FIGS. 3 and 4 are useful in understanding the manner in which charge packets $A_{IN}$ and $B_{IN}$ are transferred through the first and second channels 12 and 18 respectively during a transfer interval. FIG. 5–8 are useful in understanding the manner in which the charge packets are prevented from changing channels at the intersection.

Figure 6:
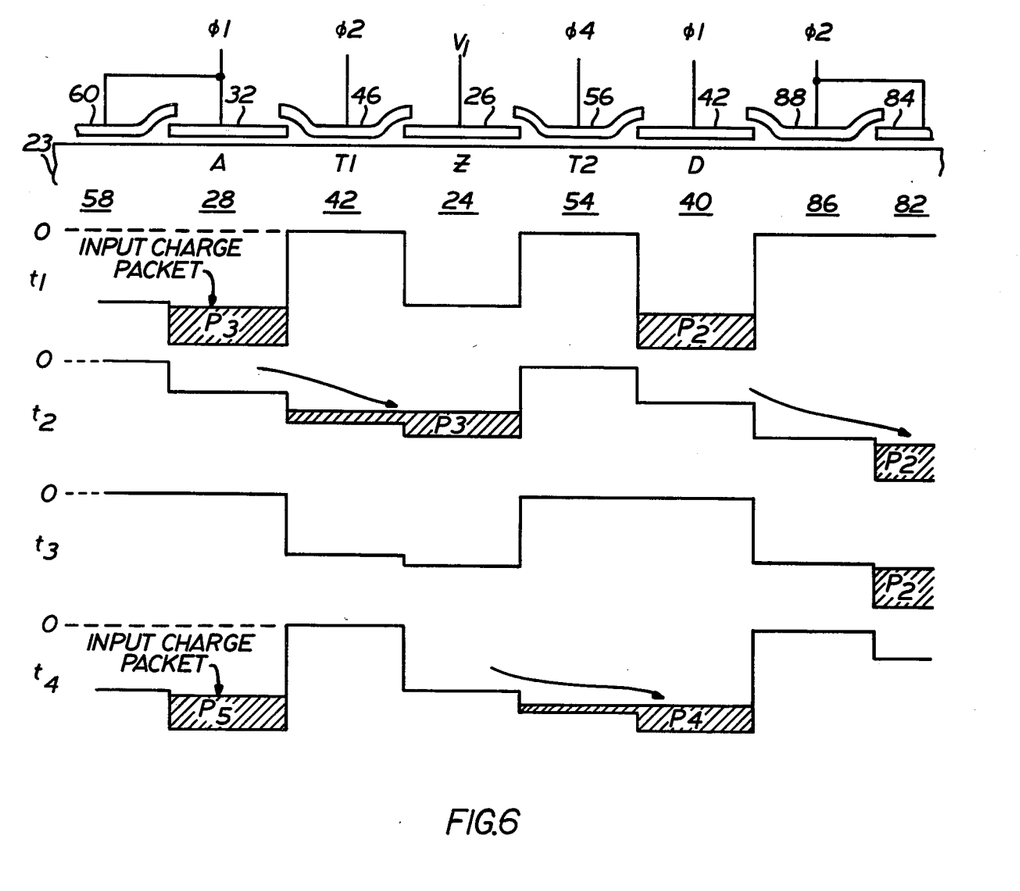
FIG. 6 is a simplified graphic representation of bias levels illustrating the manner in which transfer of a charge packet from the A storage area to the D storage area of the circuit of FIG. 1 is prevented.

At $t_1$, $\phi$ 1 is at a negative and a potential well is created beneath the A storage area 28 as shown in FIG. 3. A charge packet P1 which has been transferred during the prior transfer interval resides in the storage area 66. A new charge packet P3 flows from the storage area 58 into the potential well under the A storage area 28. A charge packet P2 transferred during the prior transfer interval resides in a potential well in the D storage area 40 as shown in FIGS. 4 and 6.

At $t_2$, both $\phi$ 2 and $\phi$ 3 switch to negative levels creating potential wells beneath the T1 transfer gate 42, the T3 transfer gate 44, the B storage area 30 and the C storage area 36. $\phi$ 4 remains at a positive level, retaining a charge barrier level under the T2 transfer gate 54. At $t_2$, $\phi$ 1 returns to 0 creating potential barriers under the T4 transfer gate 50. The charge packet P3 beneath the A storage area 28 is pushed across the T1 transfer gate 42, the common Z transfer area 24, the T3 transfer gate 44 and into the B storage area 30 as shown in FIG. 3. At the same time the previously transferred charge packet P1 is pushed out of the storage area 66. As the charge packet P3 passes across the common Z transfer area 24 the packet is prevented from transferring into the second channel 18 by the potential barriers beneath the T2 transfer gate 54 and the T4 transfer gate 50 as shown in FIGS. 4–8.

Figure 7:
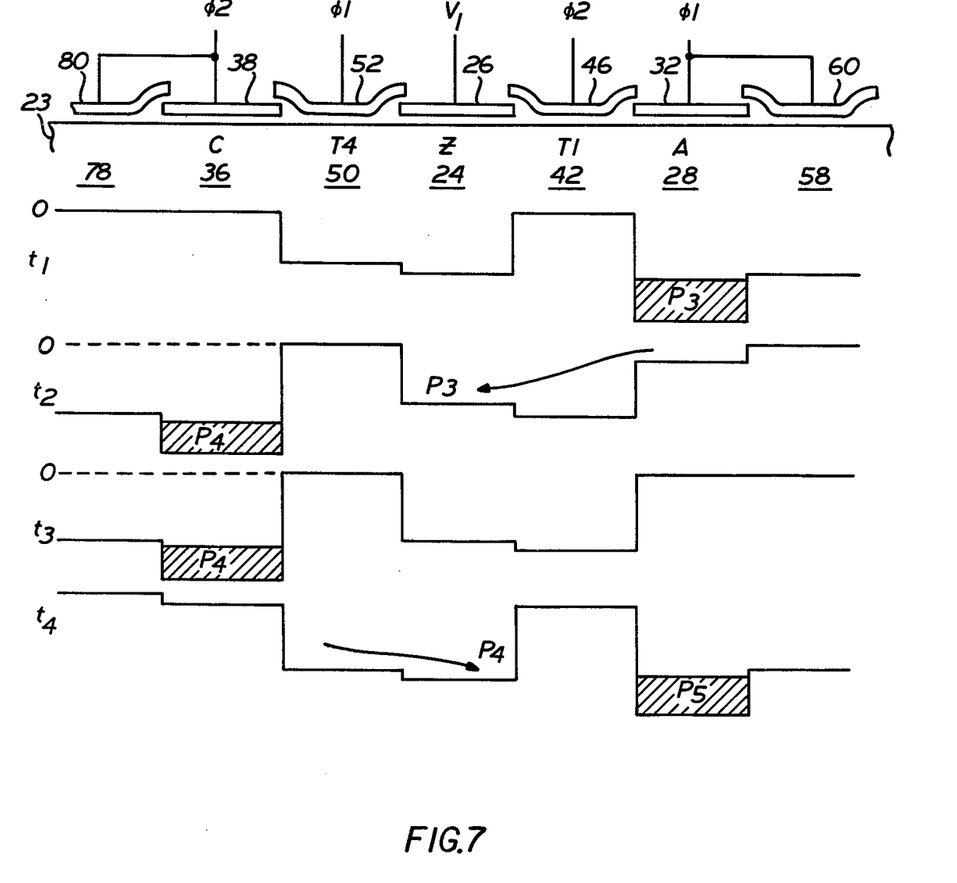
FIG. 7 is a simplified graphical representation of bias levels illustrating the manner in which transfer of a charge packet from the C storage area to the A storage area of the circuit of FIG. 1 is prevented.
Figure 8:
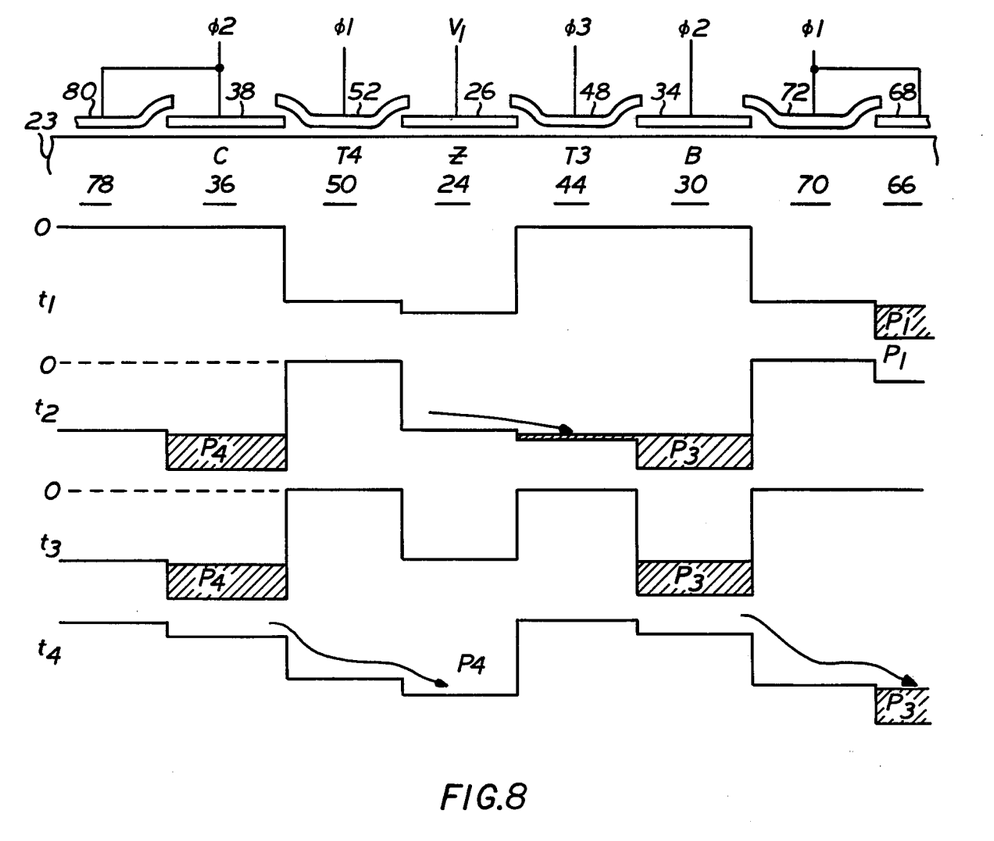
FIG. 8 is a simplified graphical representation of bias levels illustrating the manner in which transfer of a charge packet from the C storage area to the B storage area of the circuit of FIG. 1 is prevented.

At $t_2$ when $\phi$ 2 switches to its negative potential a charge packet P4 in the second channel 18 flows into the potential well under the C storage area 36 as shown in FIG. 4. The charge packet P4 is isolated from the common Z transfer area 24 by the potential barrier beneath the T4 transfer gate 50 as shown in FIGS. 4, 7 and 8. The previously transferred charge packet P2 is transferred from the D storage area 40 across the transfer gate 86 to the storage area 82 as shown in FIGS. 4 and 6.

At $t_3$, the $\phi 2$ timing signal remains at a negative potential and $\phi 3$ returns to 0 creating a potential barrier beneath the T3 transfer gate 44. This isolates the charge packet P3 in the B storage area 30 as shown in FIG. 3. At the same time the charge packet P4 remains isolated in the C storage area 36 as shown in FIGS. 4, 5, 7 and 8.

At $t_4$, both $\phi 1$ and $\phi 4$ switch to negative levels allowing potential wells beneath the T2 transfer gate 54, the T4 transfer gate 50, the A storage area 28 and the D storage area 40. $\phi 3$ remains at O, retaining a charge barrier under the T3 gate 44 as shown in FIGS. 3 and 8. $\phi 3$ returns to 0 creating potential barriers under the T1 transfer gate 42 as shown in FIGS. 3, 5, 6 and 7 and pushing the charge packet P4 held beneath the C storage area 36 across the T4 transfer gate 50, the common Z transfer area 24, the T2 transfer gate 54 and into the D storage area 40 as shown in FIG. 4. As the charge packet P4 passes across the common Z transfer area 24, passage into the first channel 12 is prevented by the barriers existing beneath the T1 transfer gate 42 and the T3 transfer gate 44 as shown in FIGS. 3, 7 and 8. The previously transferred charge packet P2 stored in the storage area 82 during $t_3$ is transferred out of the storage area 82 as shown in FIG. 6.

Figure 5:
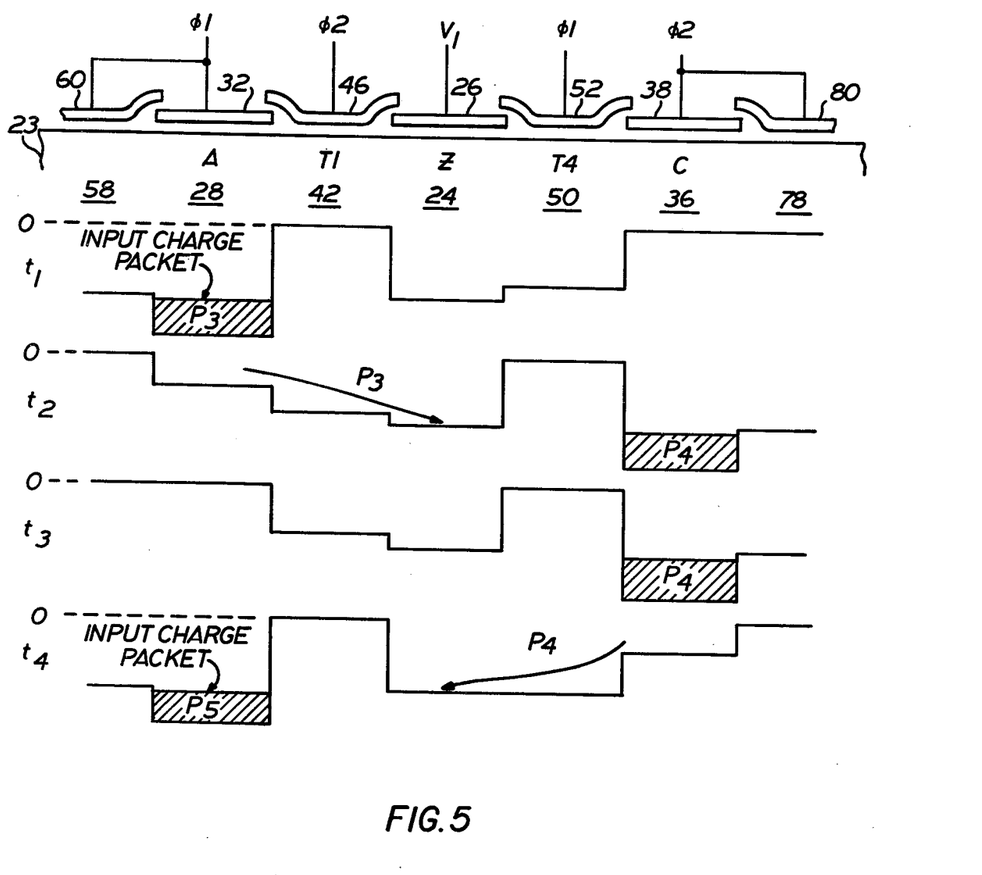
FIG. 5 is a simplified graphical representation of bias levels illustrating the manner in which transfer of a charge packet from the A storage area to the C storage area of the circuit of FIG. 1 is prevented.

At $t_4$ when $\phi 1$ switches to its negative level, the charge packet P3 held under the B storage area 30 is transferred out as shown in FIGS. 3 and 8. At the same time the next charge packet P5 introduced as $A_{IN}$ flows into the potential well created beneath the A storage area 28 as shown in FIGS. 3, 5 and 6. This charge packet beneath the A storage area 28 is isolated from the common Z transfer area 24 by the potential barrier beneath the T1 transfer gate 42 as shown in FIGS. 3, 5 and 6.

FIG. 4 depicts timing intervals $t_1'$ and $t_2'$ comprising the first half of the next transfer interval. During $t_2'$ the previously transferred charge packet P4 is transferred from the D storage area 40 in the same manner as charge packet P2 was transferred during the prior transfer interval. At the same time a new charge packet P6 is entered in the C storage area 36 in preparation for transfer in the same manner that the charge packet P4 was entered during $t_2$ of the prior transfer interval.

While the invention has been particularly shown and described with reference to a preferred embodiment thereof, it will be understood by those skilled in the art that various changes in form and details may be made therein without departing from the spirit and scope of the invention.

What is claimed is:

1. A channel crossover circuit comprising:
    a semiconductor element,
    a common transfer electrode disposed over the element and forming a common transfer area, therein
    first and second storage electrodes disposed over the element on opposite sides of and spaced apart from the common transfer electrode and forming first and second storage areas in the element,
    third and fourth storage electrodes disposed over the element on opposite sides of and spaced apart from the common transfer electrode and from the first and second storage electrodes respectively and forming third and fourth storage areas in the element,
    a first transfer electrode disposed over the element between the first storage electrode and the common transfer electrode, the first transfer electrode overlapping the common transfer electrode and the first storage electrode and forming a first transfer area with the element adjacent to the first storage area,
    a second transfer electrode disposed over the element between the second storage electrode and the common transfer electrode, the second transfer electrode overlapping the common transfer electrode and the second storage electrode and forming a second transfer area with the element adjacent to the second storage area,
    a third transfer electrode disposed over the element between the third storage electrode and the common transfer electrode, the third transfer electrode overlapping the common transfer electrode and the third storage electrode, and forming a third transfer area with the element adjacent to the third storage area,
    a fourth transfer electrode disposed over the element between the fourth storage electrode and the common transfer electrode, the fourth transfer electrode overlapping the common transfer electrode and the fourth storage electrode, and forming a fourth transfer area with the element adjacent to the fourth storage area,
    a fifth transfer electrode disposed over the element on a side of the first storage electrode away from the first transfer electrode, the fifth electrode overlapping the first storage electrode, and forming a fifth transfer area in the element adjacent to the first storage area,
    a sixth transfer electrode disposed over the element on a side of the second storage electrode away from the second transfer electrode, the sixth transfer electrode overlapping the second storage electrode, and forming a sixth transfer area in the element adjacent to the second storage area,
    a seventh transfer electrode disposed over the element on a side of the third storage electrode away from the third transfer electrode, the seventh transfer electrode overlapping the third storage electrode, and forming a seventh transfer area in the element adjacent to the third storage area,
    an eighth transfer electrode disposed over the element on a side of the fourth storage electrode away from the fourth transfer electrode, the eighth transfer electrode overlapping the fourth storage electrode, and forming an eighth transfer area in the element adjacent to the fourth storage area,
    a first channel including the first and second storage areas, the first, second, fifth and sixth transfer areas and the common transfer area,
    a second channel including the third and fourth storage areas, the third fourth, seventh and eighth transfer areas and the common transfer area, and,
    means for providing a first time-varying phased signal repetitiously alternating between opposite levels,
    means for applying the first signal to the first and fourth storage electrodes and the third, fifth and sixth transfer electrodes,
    means for providing a second time-varying signal of opposite phase from the first signal, means for applying the second signal to the second and third storage electrodes and to the first, seventh, and eighth transfer electrodes, means for providing a third signal consisting of a pulse of predetermined duration coinciding with alternate ones of the changes in level of the first and second signals, means for applying the third signal to the second transfer electrode, means for providing a fourth signal consisting of a pulse of selected duration coinciding with alternate ones of the changes in level of the first and second signals which are in between the alternate ones of the changes in level of the first and second signals with which the pulses of the third signal coincide, and means for applying the fourth signal to the fourth transfer electrode, whereby, the time-varying signals applied to the electrodes during each of a succession of transfer intervals transfers charge packets applied to the first and second channels along the first and second channels during the transfer interval.

2. The invention set forth in claim 1, further including a fifth storage electrode disposed over the element on the opposite side of the sixth transfer electrode from the second storage electrode and forming a fifth storage area, adjacent to the sixth transfer area means for applying the first signal to the fifth storage electrode, a sixth storage electrode disposed over the element on the opposite side of the eighth transfer electrode from the fourth storage electrode and forming a sixth storage area, adjacent to the eighth transfer area and means for applying the second signal to the sixth storage electrode.

* * * * *

UNITED STATES PATENT AND TRADEMARK OFFICE
CERTIFICATE OF CORRECTION

PATENT NO. : 4,237,389
DATED : December 2, 1980
INVENTOR(S) : Reginald A. Allen

It is certified that error appears in the above–identified patent and that said Letters Patent are hereby corrected as shown below:

Column 1, after "CHARGE COUPLED DEVICE CHANNEL CROSSOVER CIRCUIT", insert the following:

--The invention herein described was made in the course of or under a contract or subcontract thereunder, (or grant), with the Department of the Navy.--

*Signed and Sealed this*

*Twenty-second* Day of *February 1983*

[SEAL]

*Attest:*

*Attesting Officer*

GERALD J. MOSSINGHOFF
*Commissioner of Patents and Trademarks*